United States Patent
Schroeder et al.

(10) Patent No.: US 7,838,959 B2
(45) Date of Patent: Nov. 23, 2010

(54) RADIO FREQUENCY (RF) CIRCUIT PLACEMENT IN SEMICONDUCTOR DEVICES

(75) Inventors: Uwe Paul Schroeder, Lake Carmel, NY (US); Chu-Hsin Liang, Lake Carmel, NY (US)

(73) Assignee: Infineon Technologies AG, Neubiberg (DE)

( * ) Notice: Subject to any disclaimer, the term of this patent is extended or adjusted under 35 U.S.C. 154(b) by 144 days.

(21) Appl. No.: 12/021,893

(22) Filed: Jan. 29, 2008

(65) Prior Publication Data

US 2009/0189195 A1 Jul. 30, 2009

(51) Int. Cl.
*H01L 27/00* (2006.01)
*H01L 21/77* (2006.01)
*H03K 19/00* (2006.01)

(52) U.S. Cl. .......................... 257/499; 438/129; 716/10; 716/17

(58) Field of Classification Search ................. 257/202, 257/203, 207, 355, 360, E21.602, E25.01, 257/E25.015, E27.011, E27.028, E27.033–E27.035; 438/128, 129; 716/1, 2, 7, 8, 10, 17
See application file for complete search history.

(56) References Cited

U.S. PATENT DOCUMENTS

| | | | | |
|---|---|---|---|---|
| 5,548,135 A | * | 8/1996 | Avery | ......................... 257/173 |
| 6,404,226 B1 | | 6/2002 | Schadt | |
| 6,560,759 B2 | * | 5/2003 | Shinomiya | ...................... 716/8 |
| 6,954,083 B1 | * | 10/2005 | Thornley et al. | ............... 326/16 |
| 2003/0183403 A1 | * | 10/2003 | Kluge et al. | ............... 174/35 R |
| 2008/0201677 A1 | * | 8/2008 | Baker et al. | ...................... 716/8 |
| 2009/0189194 A1 | * | 7/2009 | Schroeder et al. | ............ 257/203 |

OTHER PUBLICATIONS

Hashemi, H., et al., "Concurrent Multiband Low-Noise Amplifiers—Theory, Design, and Applications," IEEE Transactions on Microwave Theory and Techniques, Jan. 2002, pp. 288-301, vol. 50, No. 1, IEEE, Los Alamitos, CA.
Russell, B., et al., "Offset the Reduced ESD Protection of Netgen Nanometer ICs with Off-Chip Alternatives," http://www.embedded.com/columns/technicalinsights/201806036?cid=RSSfeed_embedded_news, 2006, pp. 1-4, Embedded Systems Design, San Francisco, CA.
Salvador, J., "ESD: Evaluating ESD Protection Circuits," http://www.conformity.com/artman/publish/printer_211.shtml, 2007, pp. 1-8, Conformity, Littleton, MA.
Torres, C.A., et al., "Modular, Portable, and Easily Simulated ESD Protection Networks for Advanced CMOS Technologies," 2001, 14 pp., ESD Association, Rome, NY.
Wang, A.Z.H., et al., "An On-Chip ESD Protection Circuit with Low Trigger Voltage in BiCMOS Technology," IEEE Journal of Solid-State Circuits, Jan. 2001, pp. 40-45, vol. 36, No. 1, IEEE, Los Alamitos, CA.

\* cited by examiner

*Primary Examiner*—Sue Purvis
*Assistant Examiner*—W. Wendy Kuo
(74) *Attorney, Agent, or Firm*—Slater & Matsil, L.L.P.

(57) ABSTRACT

Semiconductor devices, methods of manufacturing thereof, and methods of arranging circuit components of an integrated circuit are disclosed. In one embodiment, a semiconductor device includes an array of a plurality of devices arranged in a plurality of rows. At least one radio frequency (RF) circuit or a portion thereof is disposed in at least one of the plurality of rows of the array of the plurality of devices.

23 Claims, 4 Drawing Sheets

RADIO FREQUENCY (RF) CIRCUIT PLACEMENT IN SEMICONDUCTOR DEVICES

TECHNICAL FIELD

The present invention relates generally to the fabrication of semiconductor devices, and more particularly to the placement and arrangement of circuit components on a die.

BACKGROUND

Semiconductor devices are manufactured by depositing many different types of material layers over a semiconductor workpiece, wafer, or substrate, and patterning the various material layers using lithography. The material layers typically comprise thin films of conductive, semiconductive, and insulating materials that are patterned, etched, or altered to form integrated circuits (ICs). There may be a plurality of transistors, memory devices, switches, conductive lines, diodes, capacitors, logic circuits, and other electronic components formed on a single die or chip, for example.

Some IC designs include radio frequency (RF) circuits. The RF circuits may include elements such as inductors, resistors, and/or capacitors, as examples. System on a chip (SoC) or embedded RF ICs may include RF circuits in some regions and digital circuitry in other regions of a die, for example. Many cellular and wireless ICs contain inductors or other RF circuits that function as antennas and are used to receive and transmit information, for example.

Some components or portions of RF circuits may be large and may require a large amount of dedicated area on an integrated circuit. As other devices on ICs such as logic circuitry, memory, and other circuitry are scaled to smaller geometries, the RF circuits may not be able to be decreased in size and continue to retain their functionality. RF circuits may occupy a large percentage of the surface area of a die and may limit a reduction in size of an IC.

What are needed in the art are improved methods of arranging RF circuits and other devices of semiconductor devices and structures thereof.

SUMMARY OF THE INVENTION

These and other problems are generally solved or circumvented, and technical advantages are generally achieved, by embodiments of the present invention, which provide novel methods of arranging circuit components on a die, wherein RF circuits or portions thereof are disposed in active circuit or standard cell arrays.

In accordance with an embodiment of the present invention, a semiconductor device includes an array of a plurality of devices arranged in a plurality of rows. At least one RF circuit or a portion thereof is disposed in at least one of the plurality of rows of the array of the plurality of devices.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in arrays of standard cells. Embodiments of the present invention may also be implemented in other types of arrays of devices or circuits, such as memory devices, logic devices, or digital circuit components, for example.

Figure 1:
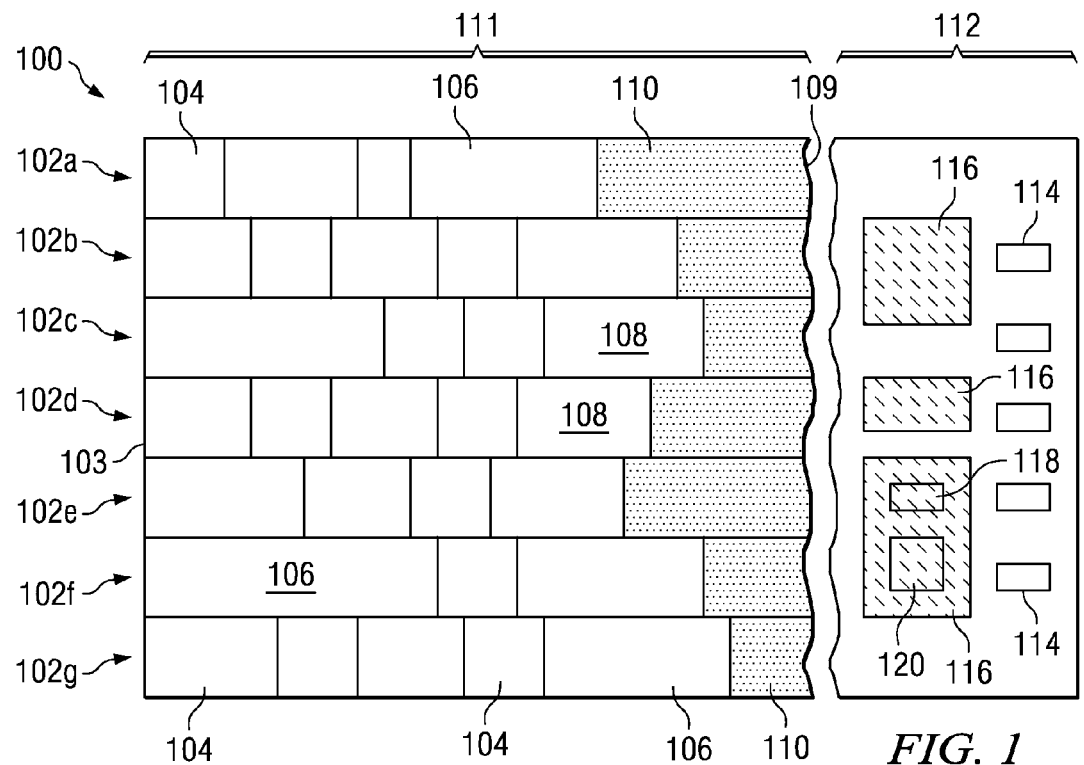
FIG. 1 shows a top view of a semiconductor device wherein an array of standard cells is arranged in a plurality of rows and has unused regions at the ends of the rows.

FIG. 1 shows a top view of a semiconductor device 100 wherein an array of standard cells 104, 106, and 108, e.g., in region 111, is arranged in a plurality of rows 102a, 102b, 102c, 102d, 102e, 102f, and 102g. Only seven rows 102a, 102b, 102c, 102d, 102e, 102f, and 102g are shown in the drawings herein; alternatively, there may be dozens or hundreds of rows in the array of standard cells 104, 106, and 108, for example. Digital designs involving devices comprising standard cells 104, 106, and 108 are common for logic circuits, for example. The standard cells 104, 106, and 108 may comprise digital circuit components that are selected from a library of standard cells, with each standard cell 104, 106, and 108 being adapted to perform a particular circuit function or functions. The standard cells 104, 106, and 108 may comprise logic functions, inverters, microprocessors, amplifiers, counters, timers, or signal splitters, as examples, although other circuit elements and functions may also be included in the library of standard cells 104, 106, and 108 and included in the array.

Some standard cells 104 may be relatively small, and other standard cells 106 may be relatively large. Other standard cells 108 may be medium-sized, for example. The standard cells 104, 106, and 108 are also referred to herein as a plurality of devices. The plurality of devices 104, 106, and 108 may also comprise memory devices, logic devices, digital circuit components, or other devices.

The standard cells 104, 106, and 108 are placed in row-like arrangements in region 111, e.g., in rows 102a, 102b, 102c, 102d, 102e, 102f, and 102g, by a compiler or a place and route tool. The compiler initiates the placement at a left edge 103 of the array and continues placing the standards cells 104, 106, and 108 towards the right edge 109 within each row 102a, 102b, 102c, 102d, 102e, 102f, and 102g. The standard cells 104, 106, and 108 are placed by the compiler proximate one another within each row 102a, 102b, 102c, 102d, 102e, 102f, and 102g according to the overall circuit design, function, and interconnectivity between the standard cells 104, 106, and 108, for example. Certain standard cells 104, 106, or 108 may be required to be adjacent to each other, or such an arrangement may be advantageous to improve performance of the device 100 and minimize wiring (e.g., wiring formed in conductive material layers of the device 100, not shown, which may be formed in a back end of the line (BEOL) process). For example, groups of smaller cells 104 may be grouped together, as shown in row 102g. The compiler may be adapted to place larger cells 106 in rows first at the left edge 103, as shown in row 102f, and then fill the remainder of the row 102f with cells having a suitable size and/or function, as another example.

Unused regions of each row 102a, 102b, 102c, 102d, 102e, 102f, and 102g are left remaining proximate the right edge 109 of the array that is opposite the left edge 103. The left edge 103 is also referred to herein as a first edge of the array, and the right edge 109 is also referred to herein as a second edge of the array, for example.

Thus, the standard cell 104, 106, and 108 layout typically resembles a left-justified typewritten page, wherein the left edge 103 comprises standard cells 104, 106, and 108 aligned together evenly, and wherein the right edge 109 comprises standard cells 104, 106, and 108 that are unaligned or jagged.

In some semiconductor device 100 applications, it is generally desirable for the topography of the top surface of a semiconductor device 100 to be substantially planar across a top surface, to improve subsequent lithography and CMP processes, for example. Thus, in a design such as the one shown in FIG. 1, non-matching row 102a, 102b, 102c, 102d, 102e, 102f, and 102g lengths (e.g., regions to the left of the right edge 109) may be filled by the compiler with dummy cells 110 in some applications. Placement algorithms of compilers usually fill in ends of rows 102a, 102b, 102c, 102d, 102e, 102f, and 102g with dummy devices or cells 110 to improve lithography processes and CMP processes, for example. The dummy devices or cells 110 typically comprise a similar topography as the standard cells 104, 106, and 108, for example, and may comprise features spaced apart by similar dimensions as features of the standard cells 104, 106, or 108.

While filling the rows 102a, 102b, 102c, 102d, 102e, 102f, and 102g with dummy cells 110 improves the homogeneity of the topography, however, filling the rows 102a, 102b, 102c, 102d, 102e, 102f, and 102g with dummy cells or devices 110 results in a wasted use of area on semiconductor devices 100. A large proportion of the chip layout may be comprised of filler or dummy cells 110 that do not serve a particular purpose in the functional operation of the semiconductor device 100. The area required by such dummy cells 110 may comprise about 10 to 60% of the area of an IC in some applications, for example.

In FIG. 1, the semiconductor device 100 comprises a first region 111 comprising an array region and a second region 112 comprising an I/O region. The I/O region 112 comprises a plurality of I/O pads 114 that may be used for making electrical contact to the semiconductor device 100. The I/O pads 114 may comprise wire bond pads adapted for use with flip chip or ball grid array contact schemes, as examples, although other types of contacts and electrical connection methods may also be used. The I/O pads 114 may be used in the packaging of the finished IC, or to make contact to other ICs, e.g., in a multi-chip device, for example.

RF circuitry 116 may be placed proximate the I/O pads 114 in the I/O region 112, as shown. The RF circuitry 116 may also be placed in a dedicated region of the device 100 separate from the first region 111 or the second region 112, for example, not shown in the drawings. The RF circuitry 116 may comprise digital circuitry adapted to emulate analog circuitry, for example. The RF circuitry 116 may comprise an analog to digital (A to D) converter, D to A converter, or phase lock loop (PLL) controller or function, as examples. The RF circuitry 116 may also comprise RF or analog circuits adapted to perform other functions.

The RF circuitry 116 may comprise active elements 118 and passive elements 120. The active elements 118 may comprise switches, transistors, thyristors, and other elements, as examples. During operation, the active elements 118 are electrically active, e.g., they have control functions, current driving functions, or other functions that they perform. The passive elements 120 typically comprise resistors, capacitors, inductors, transformers, antennas, or other passive elements that may be used to transmit or receive information, for examples. The passive elements 120 may comprise metal-insulator-metal (MIM) capacitors formed in multiple metallization layers of the semiconductor device 100, for example.

In some applications, the passive elements 120 of the RF circuitry 116 may be rather large in order to perform their particular function. For example, an RF circuit 116 may comprise a transceiver adapted to send and receive cellular or wireless information, and may include a relatively large inductor. Thus, portions of the RF circuitry 116 such as the passive elements 120 or alternatively the active elements 118 may require a relatively large amount of surface area on the semiconductor device 100, limiting the amount that the device 100 may be scaled down in size, for example. The RF circuitry 116 may be located in a dedicated region of the IC proximate or adjacent to the I/O pads 114 in some designs, e.g., in a portion of region 112, as shown in FIG. 1.

Embodiments of the present invention achieve technical advantages by providing novel RF circuit 116 placement in semiconductor devices 100. Embodiments of the present invention advantageously utilize unused areas of standard cell 104, 106, and 108 arrays for the placement of RF circuitry 116 and portions 118 and 120 thereof.

Figure 2:
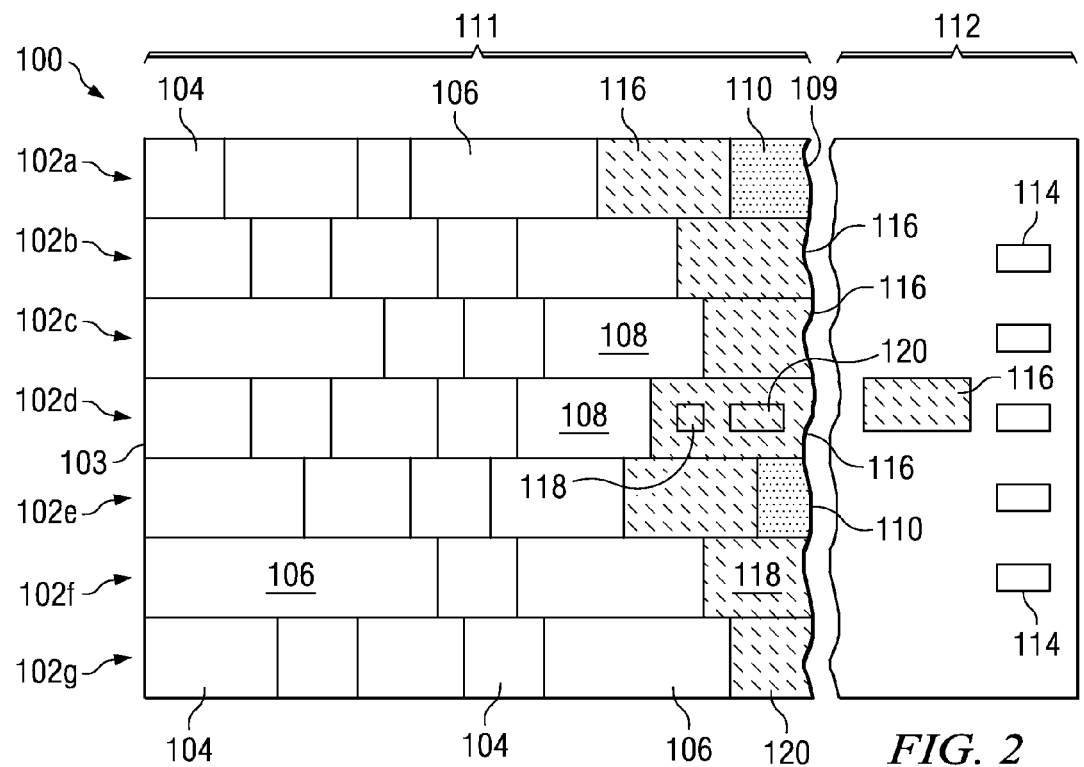
FIG. 2 shows a top view of a semiconductor device in accordance with an embodiment of the present invention that includes a plurality of RF circuits or portions thereof disposed in at least one of the rows of the array of standard cells proximate the end of the row.

FIG. 2 shows a top view of a semiconductor device 100 in accordance with an embodiment of the present invention. Like numerals are used for the various elements and materials that were used to describe FIG. 1. To avoid repetition, each reference number shown in FIG. 2 is not described again in detail herein. Rather, similar materials and elements 102, 104, 106, etc. . . . are preferably used for the various materials and elements that were used to describe FIG. 1.

The semiconductor device 100 includes a plurality of RF circuits 116 or portions 118 and 120 thereof disposed in at least one of the rows 102a, 102b, 102c, 102d, 102e, 102f, and 102g of the array of standard cells 104, 106, and 108. In this embodiment, RF circuits 116 or portions 118 or 120 thereof are disposed in the unused portions of the rows 102a, 102b, 102c, 102d, 102e, 102f, and 102g. For example, after the compiler or place and route tool positions the standard cells 104, 106, and 108 in the rows 102a, 102b, 102c, 102d, 102e, 102f, and 102g, the unused ends of the rows 102a, 102b, 102c, 102d, 102e, 102f, and 102g proximate the right edge 109 are filled at least partially with RF circuits 116 or portions 118 and 120 thereof.

Some RF circuits 116 or portions 118 and 120 thereof may be positioned in region 112 proximate the I/O pads 114, as shown, and other RF circuits 116 or portions 118 and 120 thereof may be placed in the array of standard cells 104, 106, and 108, in accordance with embodiments of the present invention. Areas of the standard cell 104, 106, and 108 array not filled either by the standard cells 104, 106, and 108 or by the RF circuits 116 or portions 118 and 120 thereof optionally may be filled with dummy cells 110, as shown in FIG. 2, for example, to improve CMP and lithography processes in the manufacturing processes of the semiconductor device 100.

By filling unused portions of rows 102a, 102b, 102c, 102d, 102e, 102f, and 102g of the array with RF circuits 116 or portions 118 and 120 thereof, the area needed for RF structures or circuits 116 in dedicated regions of the die or in the I/O region 112 may advantageously be greatly diminished, in accordance with embodiments of the present invention.

At least one of the RF circuits 116 or portions 118 or 120 thereof may be coupled to at least one of the I/O pads 114 for the semiconductor device 100 in conductive material layers of the semiconductor device 100, not shown in the drawings. Alternatively, the RF circuits 116 may also be coupled to at least one of the devices 104, 106, and 108 in region 111, also not shown.

In the embodiment shown in FIG. 2, the RF circuits 116 or portions 118 or 120 thereof are disposed proximate the second edge 109 of the array, but not proximate the first edge 103. Alternatively, in other embodiments, the RF circuits 116 or portions 118 or 120 thereof may be placed in other regions of the array, to be described further herein.

In some embodiments, a compiler may be adapted to completely fill the first several rows 102a, 102b, 102c, 102d, 102e, and 102f of the array with standard cells 104, 106, and 108, and after the arrangement of the standard cells 104, 106, and 108, then fill any remaining portions of rows such as rows 102f and 102g with RF circuits 116 or portions 118 and 120 thereof, not shown in the drawings. In these embodiments, the RF circuits 116 or portions 118 and 120 thereof are positioned primarily in a region of the array proximate a bottom edge of the array, for example. Unused ends of the rows 102a, 102b, 102c, 102d, 102e, 102f, and 102g may then optionally be filled with dummy cells 110.

Figure 3:
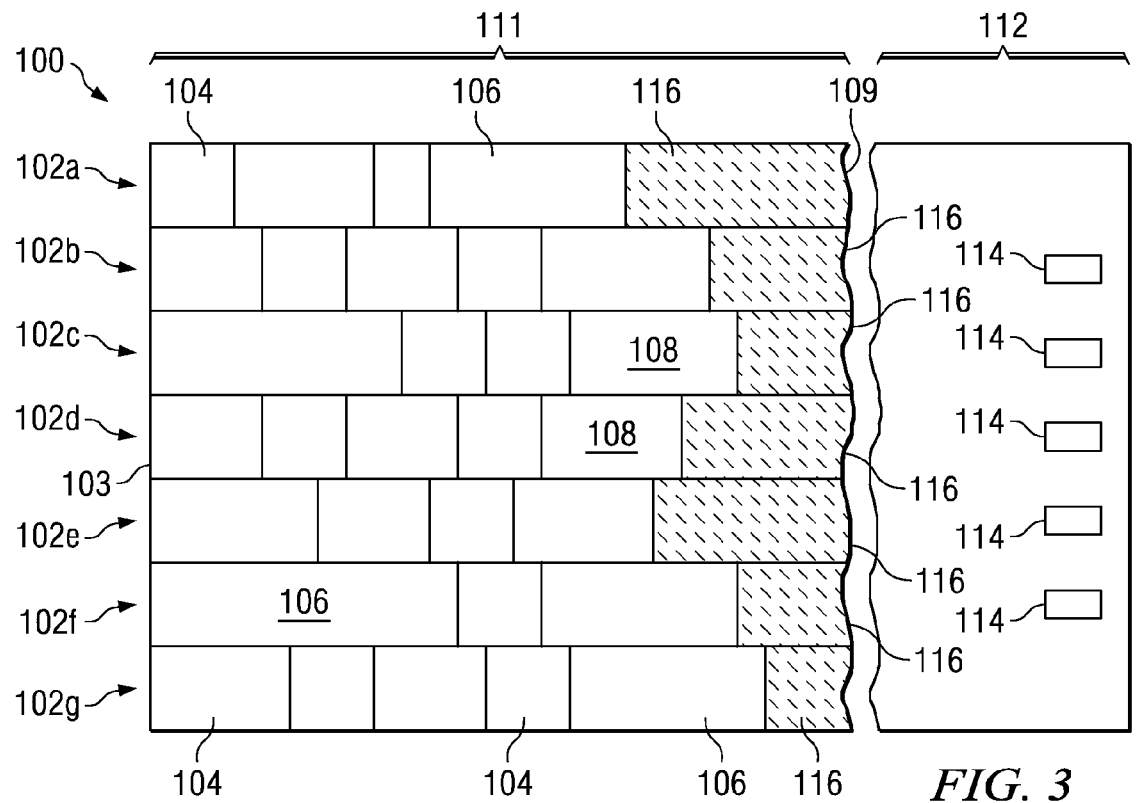
FIG. 3 shows a top view of another embodiment of the present invention, wherein all of the RF circuits of the semiconductor device are disposed in the array of standard cells.

In some embodiments, all of the RF circuits 116 or portions 118 and 120 thereof for the semiconductor device 100 are preferably placed in the array of standard cells 104, 106, and 108 in the array region in region 111, as shown in FIG. 3 in a top view. The I/O region 112 containing the I/O pads 114 may advantageously be made smaller in these embodiments, or dedicated regions otherwise used for the RF circuits 116 may be used for other circuitry, for example, allowing a reduction in the overall size of the die or chip.

Figure 4:
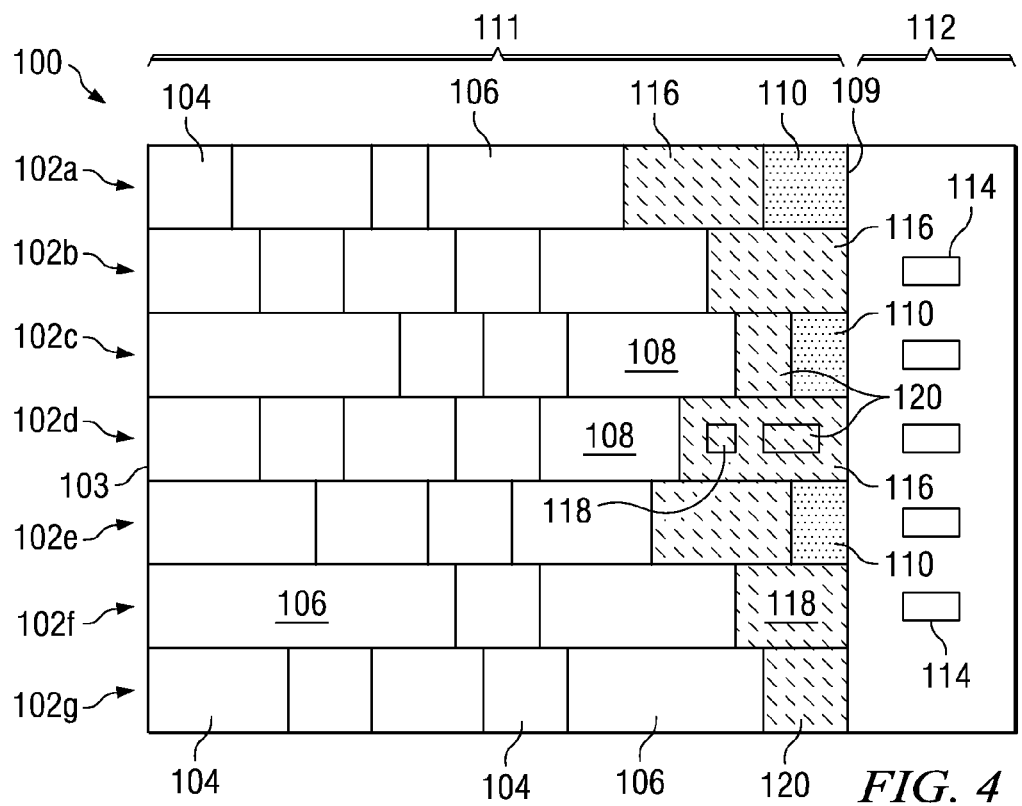
FIG. 4 shows a top view of an embodiment of the present invention, wherein an edge of the array containing the RF circuits or portions thereof is disposed proximate or adjacent I/O pads of the semiconductor device.

In some embodiments, the right edge 109 of the standard cell 104, 106, and 108 array containing all of the RF circuits 116 or portions 118 and 120 thereof is preferably disposed proximate or adjacent I/O pads 114 in the I/O region 112 of the device 100, as shown in FIG. 4 in a top view. This is advantageous and may improve the performance of the semiconductor device 100 in some applications, because the length of the wiring from the I/O pads 114 to the RF circuits 116 or portions 118 and 120 is minimized, resulting in minimization of losses of the RF signals to and from the RF circuits 116, for example.

In the embodiments shown in FIGS. 2 through 4, the RF circuits 116 are defined or arranged in the array after the digital content, e.g., after the standard cell 104, 106, and 108 content or layout is finalized within the array, either row by row, or after all of the standard cell 104, 106, and 108 layout is finalized. However, in other embodiments of the present invention, the RF circuit 116 arrangement may be defined simultaneously with the digital content or arrangement, as shown in FIG. 5, or before the digital content is finalized, as shown in FIG. 6.

Figure 5:
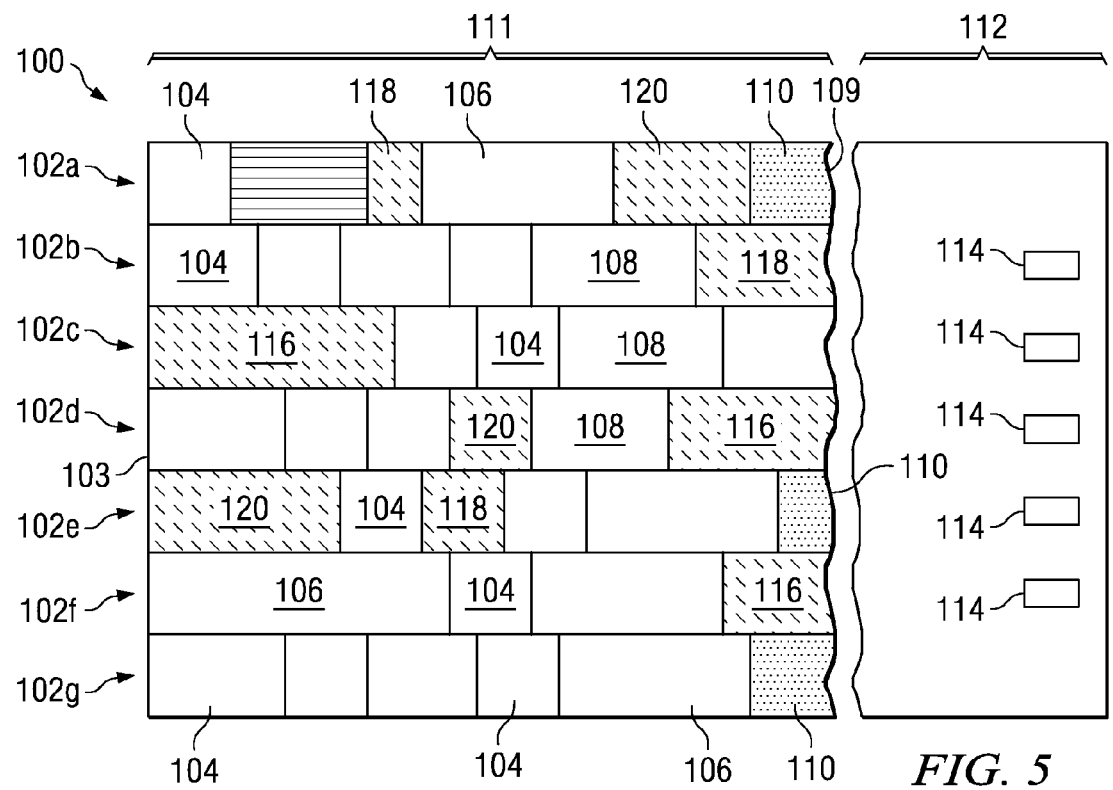
FIG. 5 shows a top view of yet another embodiment of the present invention, wherein the RF circuits or portions thereof are disposed at left and right edges, and also in a central region of the array.

For example, FIG. 5 shows a top view of yet another embodiment of the present invention, wherein the RF circuits 116 or portions 118 and 120 thereof are disposed both at the left 103 and right 109 edges of the standard cell 104, 106, and 108 array, and also in a central region of the array between the left and right edges 103 and 109. In this embodiment, after the standard cells 104, 106, and 108 are selected and designed, and after the RF circuitry 116 is designed, both the standard cells 104, 106, and 108 and the RF circuits 116 or portions 118 or 120 thereof are arranged (e.g., by a compiler or place and route tool), row 102a, 102b, 102c, 102d, 102e, 102f, and 102g by row 102a, 102b, 102c, 102d, 102e, 102f, and 102g. The RF circuits 116 or portions 118 or 120 thereof may be interspersed with the standard cells 104, 106, and 108 within each row 102a, 102b, 102c, 102d, 102e, 102f, and 102g, in this embodiment. The standard cells 104, 106, and 108 may be simultaneously arranged by the compiler in the array with the arrangement of the RF circuits 116 or portions 118 and 120 thereof in the array, for example.

Figure 6:
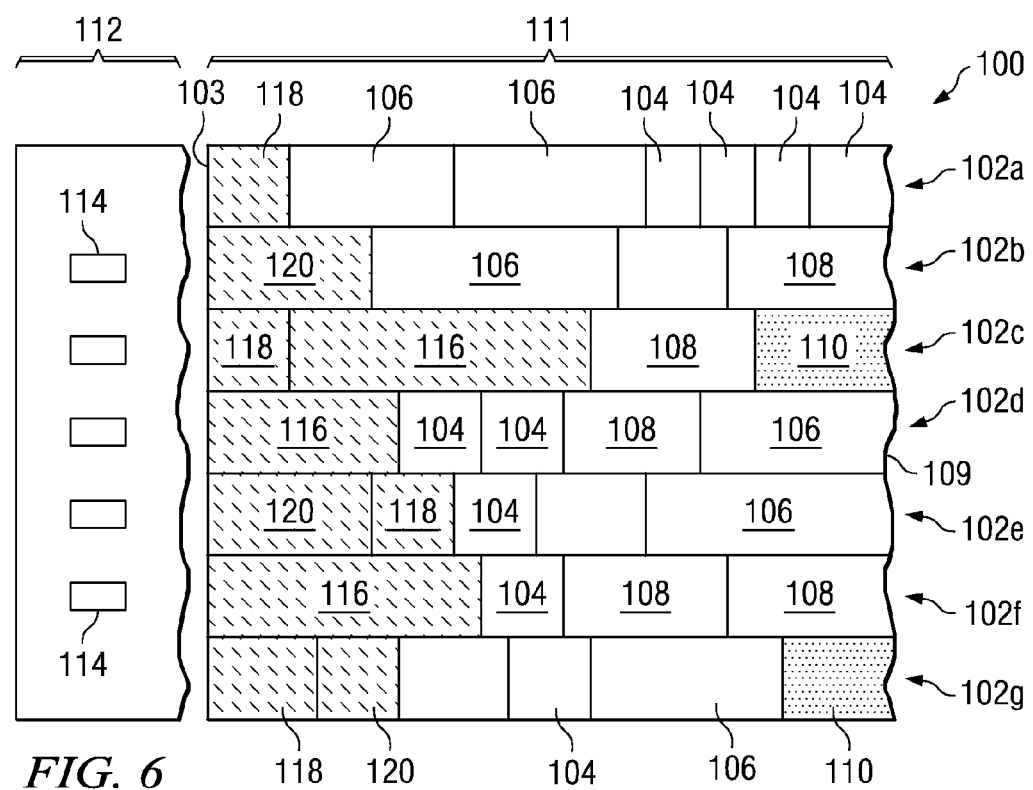
FIG. 6 shows a top view of another embodiment of the present invention, wherein the RF circuits or portions thereof are arranged in the array at the left edge before the standard cells are arranged in the array.

FIG. 6 shows a top view of another embodiment of the present invention, wherein the RF circuits 116 or portions 118 or 120 thereof are arranged in the array before the standard cells 104, 106, or 108 are arranged in the array. In this embodiment, the RF circuits 116 or portions 118 and 120 thereof are arranged in the array before the standard cells 104, 106 and 108 are arranged in the array by the compiler. Thus, in this embodiment, the RF circuits 116 or portions 118 and 120 thereof may be aligned at the left side or left edge 103, as shown in FIG. 6. The remaining regions of the rows 102a, 102b, 102c, 102d, 102e, 102f, and 102g are then filled with the standard cells 104, 106, and 108, and optionally also with dummy cells 110 if any unused regions at the right ends of the rows 102a, 102b, 102c, 102d, 102e, 102f, and 102g are left remaining, as shown in FIG. 6.

Alternatively, the compiler may be adapted to fill the first row 102a or the first few rows 102a, and 102b or 102c, as examples, entirely with the RF circuits 116 or portions 118 and 120 thereof, not shown in the drawings. The compiler subsequently then fills the remainder of the rows 102b, 102c, 102d, 102e, 102f, and 102g of the array with the standard cells 104, 106, and 108. In these embodiments, the RF circuits 116 or portions 118 and 120 thereof are positioned primarily in a region of the array proximate a top edge of the array, for example. Unused ends of the rows 102a, 102b, 102c, 102d, 102e, 102f, and 102g may then optionally be filled with dummy cells 110.

Figure 7:
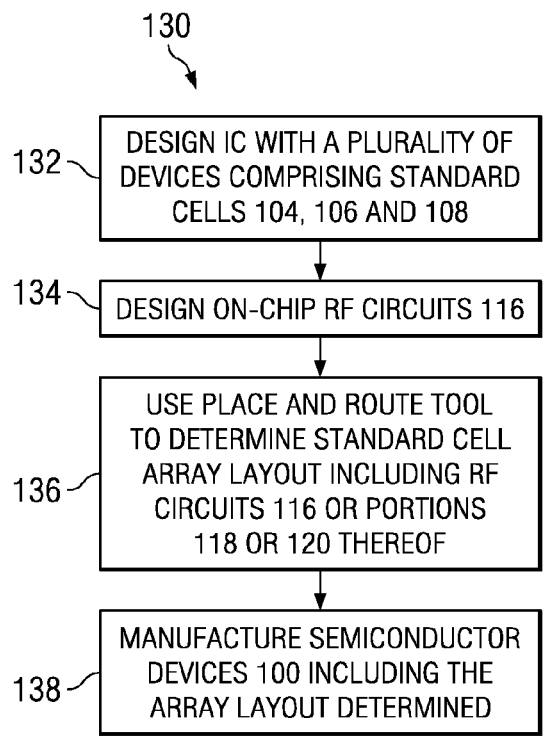
FIG. 7 is a flow chart illustrating a method of fabricating a semiconductor device in accordance with an embodiment of the present invention.

FIG. 7 is a flow chart 130 illustrating a method of fabricating a semiconductor device 100 in accordance with an embodiment of the present invention. First, an IC is designed that comprises a plurality of devices comprising standard cells 104, 106, and 108 (step 132). On-chip RF circuitry 116 is then designed, which may be dependant on and may vary as a function of the IC design, for example (step 134). An automated place and route tool, such as a compiler or place and route tool supplied by an IC design automation supplier such as Cadence, Magma, or other suppliers, is used to determine a standard cell 104, 106, and 108 array layout that includes the RF circuits 116 or portions 118 or 120 thereof (step 136), using one of the novel methods of embodiments of the present invention described herein and shown in FIGS. 2 through 6, for example. Semiconductor devices 100 are then manufactured that include the array layout determined (step 138).

Figure 8:
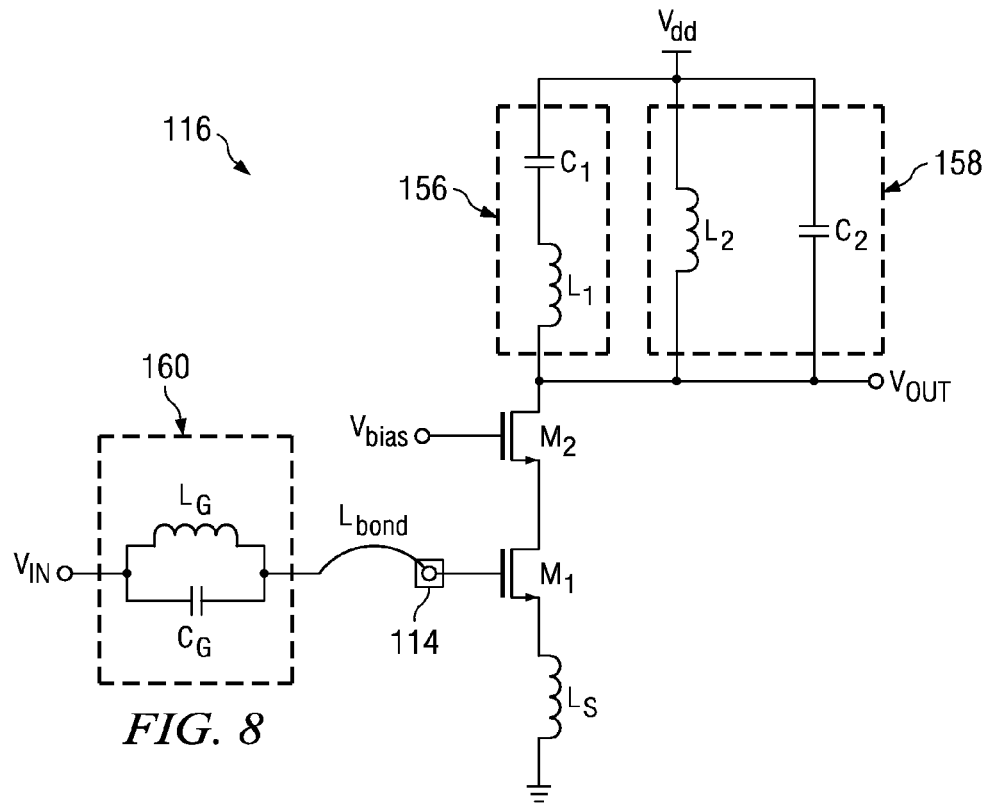
FIG. 8 shows a schematic of an example of an RF circuit in accordance with an embodiment of the present invention.

FIG. 8 shows a schematic of an example of an RF circuit 116 that may be included in an array of devices in a region 111 of a semiconductor device 100 in accordance with an embodiment of the present invention. The RF circuit 116 shown in FIG. 8 is merely exemplary of a possible RF circuit 116 that may be implemented in a semiconductor device 100 in accordance with embodiments of the present invention; alternatively, the RF circuit 116 may comprise other RF circuits, RF elements or combinations thereof.

The RF circuit 116 shown in FIG. 8 comprises a dual-band complementary metal oxide semiconductor (CMOS) low noise amplifier (LNA). The RF circuit 116 may be implemented in semiconductor devices 100 adapted for use in mobile radio cellular systems, radio communications, radio receivers, and other devices and applications, for example.

The RF circuit 116 comprising the LNA shown in FIG. 8 includes two transistors comprising metal oxide semiconductor field effect transistors (MOSFETs) $M_1$ and $M_2$. The transistors $M_1$ and $M_2$ comprise active elements 118, for example. The source of transistor $M_1$ is coupled to an inductor $L_S$ that is coupled to ground. The drain of transistor $M_1$ is coupled to the source of transistor $M_2$. The gate of transistor $M_2$ is coupled to a bias voltage $V_{bias}$ terminal. An output voltage $V_{out}$ terminal is coupled to the drain of transistor $M_2$. The gate of transistor $M_1$ is coupled to a bond pad which may comprise an I/O pad 114.

The RF circuit 116 includes a series LC network 156 comprising an inductor $L_1$ coupled in series with a capacitor $C_1$. The series LC network 156 is coupled between the drain of transistor $M_2$ and a voltage supply $V_{dd}$ terminal. A parallel LC network 158 comprising an inductor $L_2$ coupled in parallel with a capacitor $C_2$ is coupled between the drain of transistor $M_2$ and the voltage supply $V_{dd}$ terminal; e.g., coupled in parallel with the series LC network 156, as shown.

The LNA 116 includes a parallel LC network 160 coupled in series with the inevitable inductance $L_{bond}$ of a bonding wire and package lead (not shown) coupled to the I/O pad 114. The parallel LC network 160 comprises an inductor $L_G$ coupled in parallel with a capacitor $C_G$ which are coupled between the bond pad 114 and an input voltage $V_{IN}$ terminal. The parallel LC network 160 functions as an input parallel resonator, wherein capacitor $C_G$ may comprise a multilayer capacitor and inductor $L_G$ may be formed as a winding in one or more conductive material layers of the semiconductor device 100. The inductors $L_S$, $L_G$, $L_1$, and $L_2$ and capacitors $C_G$, $C_1$, and $C_2$ may comprise passive elements 120 of the RF circuit 116, for example.

In accordance with an embodiment of the present invention, some or all of the inductors $L_S$, $L_G$, $L_1$, and $L_2$ and capacitors $C_G$, $C_1$, and $C_2$ comprising the passive elements 120 of the RF circuit 116 may be implemented in standard cell arrays, e.g., in regions 111. Or, one or both of the transistors $M_1$ and $M_2$ comprising the active elements 118 of the RF circuit 116 may be implemented in standard cells arrays in region 111. Or, alternatively, some portions or all portions of the RF circuits 116 may be implemented in standard cell arrays in region 111, as previously described herein.

Embodiments of the present invention also comprise methods and algorithms for arranging circuit components of an integrated circuit or semiconductor device 100. The method may be included in the algorithm of compiler or automated place and route tool, for example. In accordance with one embodiment, for example, a method of arranging circuit components of an integrated circuit includes providing a design for the integrated circuit, the design comprising a plurality of devices 104, 106, or 108 and at least one RF circuit 116 or portions 118 or 120 thereof. The plurality of devices 104, 106, or 108 is arranged in an array comprising a plurality of rows 102a through 102g. At least one RF circuit 116 or a portion 118 or 120 thereof is included in at least one of the plurality of rows 102a through 102g of the array.

Embodiments of the present invention include semiconductor devices 100 including the novel RF circuit 116 and device 104, 106, and 108 placement described herein. Embodiments of the present invention also include methods of fabricating the semiconductor devices 100 described herein, for example. The RF circuits 116 described herein may comprise any type of RF circuitry typically used for on-chip RF, for example. The RF circuits 116 or portion 118 or 120 thereof may be formed in a conductive material layer of the semiconductor device 100, a semiconductive material layer of the semiconductor device 100, an active area region of the semiconductor device 100, a contact region or material layer of the semiconductor device 100, or combinations thereof, as examples.

Advantages of embodiments of the invention include providing novel RF circuit 116 placement methods that save space on a semiconductor device 100 and make more efficient use of surface area. The more efficient use of surface area may allow a reduction in the size of an IC or die in some applications, for example.

CMP processes and lithography processes are improved, because the RF circuits 116 or portions 118 or 120 thereof are positioned in otherwise unused areas of the standard cell 104, 106, and 108 arrays. Dummy cells 110 may optionally be included in the array to further improve CMP and lithography processes, in some embodiments.

All of the RF circuits 116 for the devices 100 may be placed in the array, eliminating the need for a dedicated region on a die for the RF circuitry 116. The RF circuits 116 or portions 118 or 120 thereof may be positioned completely at a left edge, a right edge, a top edge, or a bottom edge of an array in some embodiments, or the RF circuits 116 or portions 118 or 120 thereof may be interspersed throughout the array in other embodiments.

Embodiments of the present invention are easily implementable in existing manufacturing process flows for semiconductor devices 100, with few additional processing steps being required for implementation of the invention, for example. Embodiments of the present invention are useful in many digital circuit designs embedded with RF circuits, such as application specific ICs (ASICs), microprocessors, memory devices, or digital CMOS devices that are embedded with RF circuits, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    an array of a plurality of standard cells arranged in a plurality of rows, wherein a first portion of a radio frequency (RF) circuit is disposed in a first row of the plurality of rows, wherein a second portion of the RF circuit is disposed in a second row of the plurality of rows, wherein the first and the second portions of the RF circuit are disposed on a region of the plurality of rows not comprising any devices of the plurality of standard cells, wherein a first edge of the array of the plurality of standard cells is aligned evenly along a first straight line, and wherein a second edge of the array of the plurality of standard cells is unaligned with respect to the first straight line, the second edge being opposite to the first edge.

2. The semiconductor device according to claim 1, further comprising a plurality of input/output (I/O) pads proximate the array, wherein the RF circuit is coupled to at least one of the plurality of I/O pads or to at least one of the plurality of standard cells.

3. The semiconductor device according to claim 1, wherein the array comprises a first edge and a second edge opposite the first edge, wherein the first and the second portions of the RF circuit are disposed proximate the second edge of the array.

4. The semiconductor device according to claim 3, further comprising a plurality of input/output (I/O) pads, wherein the second edge is proximate the plurality of I/O pads.

5. The semiconductor device according to claim 3, wherein the first and the second portions of the RF circuit are disposed proximate the second edge of the array, but not the first edge.

6. The semiconductor device according to claim 1, further comprising a plurality of RF circuits, wherein the array comprises a first edge and a second edge opposite the first edge, and wherein the plurality of RF circuits is disposed proximate the first edge, the second edge, or between the first edge or the second edge in the plurality of rows.

7. The semiconductor device according to claim 1, further comprising a dummy cell disposed in at least one of the plurality of rows.

8. A method of arranging circuit components of an integrated circuit, the method comprising:
    providing a design for the integrated circuit, the design comprising a plurality of standard cells and at least one radio frequency (RF) circuit;
    arranging the plurality of standard cells in an array comprising a plurality of rows, wherein a first edge of the plurality of standard cells is aligned evenly along a straight line, and wherein a second edge of the plurality of standard cells is unaligned with respect to the straight line, the second edge being opposite to the first edge; and
    including the at least one RF circuit or a portion thereof in at least one of the plurality of rows of the array, the at least one RF circuit disposed in a region not comprising any devices of the plurality of standard cells.

9. The method according to claim 8, wherein arranging the plurality of standard cells in the array comprises first, arranging the plurality of standard cells in the array, and second, including the at least one RF circuit or the portion thereof in the at least one of the plurality of rows of the array.

10. The method according to claim 9, further comprising including all of the plurality of standard cells of the integrated circuit in the array in upper rows of the array, and then arranging the at least one RF circuit or the portion thereof in lower rows of the array; or, filling at least one row partially with at least one of the plurality of standard cells, and then filling the remainder of the at least one row with the at least one RF circuit or the portion thereof.

11. The method according to claim 8, wherein arranging the plurality of standard cells in the array comprises first, including the at least one RF circuit or the portion thereof in the at least one of the plurality of rows of the array, and second, arranging the plurality of standard cells in the array.

12. The method according to claim 11, further comprising including all of the at least one RF circuits or the portions thereof of the integrated circuit in the array in upper rows of the array, and then arranging the plurality of standard cells in lower rows of the array; or, filling at least one row partly with the at least one RF circuit or the portion thereof, and then filling the remainder of the at least one row with at least one of the plurality of standard cells.

13. The method according to claim 8, wherein the method includes simultaneously arranging the plurality of standard cells in the array comprising the plurality of rows and including the at least one RF circuit or the portion thereof in the at least one of the plurality of rows of the array.

14. The method according to claim 8, wherein including the at least one RF circuit or the portion thereof in the at least one of the plurality of rows of the array comprises including a portion of the at least one RF circuit, the portion comprising a passive element of the at least one RF circuit.

15. The method according to claim 8, wherein including the at least one RF circuit or the portion thereof in the at least one of the plurality of rows of the array comprises including a portion of the at least one RF circuit, the portion comprising an active element of the at least one RF circuit.

16. The method according to claim 8, wherein the method comprises an algorithm of a compiler or a place and route tool.

17. A method of manufacturing a semiconductor device, the method comprising:
    forming an array of a plurality of standard cells arranged in a plurality of rows over a workpiece, wherein a first edge of the array of the plurality of standard cells is aligned evenly along a straight line, and wherein a second edge of the array of the plurality of standard cells is unaligned with respect to the straight line, the second edge being opposite to the first edge; and forming at least one radio frequency (RF) circuit comprising a first portion and a second portion, the first and the second portions disposed in different rows of the plurality of rows, the at least one RF circuit disposed in a region not comprising any devices of the plurality of standard cells.

18. The method according to claim 17, wherein forming the at least one RF circuit comprises forming a passive element of the at least one RF circuit comprising a capacitor, a resistor, an inductor, a transformer, or an antenna.

19. The method according to claim 17, wherein forming the at least one RF circuit comprises forming the at least one RF circuit in a conductive material layer of the semiconductor device, a semiconductive material layer of the semiconductor device, an active area region of the semiconductor device, a contact region or material layer of the semiconductor device, or combinations thereof.

20. The method according to claim 17, wherein forming the array of the plurality of standard cells comprises forming an inverter, a microprocessor, an amplifier, a counter, a timer, or a signal splitter.

21. The method according to claim 17, further comprising forming a plurality of input/output (I/O) pads proximate the array, and coupling the at least one RF circuit to at least one of the plurality of I/O pads or to at least one of the plurality of standard cells in the array.

22. The method according to claim 21, wherein forming the plurality of I/O pads comprises forming the plurality of I/O pads in an I/O region of the semiconductor device, wherein the at least one RF circuit comprises at least one first RF circuit, further comprising forming at least one second RF circuit in the I/O region proximate the plurality of I/O pads.

23. The method according to claim 17, wherein forming the at least one RF circuit in the plurality of rows of the array comprises forming all on-chip RF circuitry for the semiconductor device.

* * * * *